US006587521B1

(12) United States Patent
Matui

(10) Patent No.: US 6,587,521 B1
(45) Date of Patent: Jul. 1, 2003

(54) SIGNAL ESTIMATOR AND PROGRAM STORED MEMORY MEDIUM

(75) Inventor: Hitosi Matui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/459,120

(22) Filed: Dec. 10, 1999

(30) Foreign Application Priority Data

Dec. 17, 1998 (JP) .......................................... 10-359847

(51) Int. Cl.[7] ............................ H03D 1/00; H04L 27/06

(52) U.S. Cl. ....................... 375/341; 375/327; 375/375; 714/798

(58) Field of Search ................................ 375/376, 375, 375/294, 327, 341, 340, 371; 714/794, 795, 796, 798

(56) References Cited

U.S. PATENT DOCUMENTS 6,085,351 A * 7/2000 Alberty ...................... 714/798
6,144,708 A * 11/2000 Maruyama .................. 375/327
6,334,203 B1 * 12/2001 Inagawa ..................... 714/798
6,473,470 B1 * 10/2002 Matui ......................... 375/340

FOREIGN PATENT DOCUMENTS

JP 10-359847 12/1998 .................... 27/14

* cited by examiner

*Primary Examiner*—Phuong Phu
(74) *Attorney, Agent, or Firm*—Michael Best & Friedrich LLC

(57) ABSTRACT

A signal estimator is provided that can track a large frequency offset. A received signal distorted in a transmission path is phase-rotated by the phase rotator (102) and is then estimated by the maximum likelihood sequence estimator (MLSE) (103). The phase detector (105) detects a phase difference between a signal obtained by delaying the phase-rotated signal and information about a minimum path metric in the Viterbi algorithm operation by the MLSE. After the phase difference signal is filtered, the voltage-controlled oscillator (VCO) receives the filtered signal. Then, the phase rotation is controlled with the output of the VCO.

15 Claims, 7 Drawing Sheets

SIGNAL ESTIMATOR AND PROGRAM STORED MEMORY MEDIUM

BACKGROUND OF THE INVENTION

The present invention relates to a signal estimator with a phase locked loop, that detects and corrects the phase of a received signal, particularly, deteriorated due to transmission distortion in a digital transmission/communication system in a transmission path. Furthermore, the present invention relates to a memory medium storing programs.

A prior art phase locked loop with an equalizer is disclosed in JP-A-327204/1998. This phase locked loop can correct phase errors even under the environment of a frequency selective path fading in the radio data communication terminal adopting the system of obtaining transmission path characteristics during a preamble period to equalize received signals.

FIG. 14 shows the configuration of a prior art signal estimator with a phase locked loop. Referring to FIG. 14, a delayed decision feedback sequence estimator (DDFSE) 303 estimates a transmission signal sequence with a distorted received signal. In order to create replicas of the received signal, a replica creator 305 convolutes a previously-obtained transmission path impulse response value and a sequence signal estimated by the DDFSE 303.

In this prior art, a phase error signal in a phase locked loop operation is created with the replica signal. This method can subject even received signals with a large transmission distortion to a high-precision phase synchronous correction and operation.

A delay element 304 delays a received signal to compensate the delay caused by the DDFSE 303. Thus, the timing of the output signal of the replica creator 305 can be coincided with that of the output signal of the delay element 304. The phase detector 306 detects the phase difference between the output signal of the replica creator 305 and the output signal of the delay element 304. When the received signal has frequency offset, the phase between transmission and reception changes over time, so that the phase difference obtained by the phase detector 306 varies over time.

Since the transmission path impulse response is constant, the replica creator 305 outputs the received signal with low phase error so long as the DDFSE 303 estimates correctly. However, since the output signal of the delay element 304 varies in phase, the phase detector 306 produces the phase difference. A filter 307 limits the frequency bandwith of the output signal of the phase detector 306 and then outputs the band-limited signal to a voltage-controlled oscillator (VCO) 308. A phase rotator 302 rotates the phase of the received signal with the output signal of the VCO 308. Thus, the phase rotator 302 controls the phase detector 306 to decrease the phase difference signal, so that a phase change due to a frequency offset can be absorbed. The phase rotator 302 outputs the signal of which the phase change has been absorbed.

In the signal estimator with a phase locked loop, according to the prior-art technique, a certain delay occurs till the DDFSE determines an estimated value through the sequence estimation. When a rate in phase change is low, even a large signal estimation delay of the DDFSE enables a normal operation. However, when a rate in phase change is high, the phase locked loop cannot track changes in phase. In the end, the phase is diverged.

In order to improve the phase tracking characteristic of the phase locked loop, there is, for instance, the method of speeding up the response of the phase locked loop by spreading the frequency band of the filter 307 shown in FIG. 14. However, this method tends to be susceptible to external disturbances such as noises so that the precision of tracking phase shifts is deteriorated.

Another countermeasure is to increase the response rate by reducing the estimation delay of the DDFSE. However, since decreasing the delay of the DDFSE deteriorates the estimation capability of the DDFSE, many errors occur in an estimated signal sequence so that the replica signal cannot be normally created. This means that the quality of information on phase differences obtained by the phase detector becomes degraded. Like the former countermeasure, the tracking of the phase locked loop causes disturbances due to noises or distortions contained in the received signal. Finally, the phase locked loop cannot accurately track the phase.

SUMMARY OF THE INVENTION

The present invention is made to solve the above-mentioned problems.

The objective of the invention is to provide a system that estimates a received signal subjected to large transmission distortion, using a delayed decision feedback sequence estimator (DDFSE) or maximum likelihood sequence estimator (MLSE).

Another objective of the present invention is to provide a system that can operate with high precision and at high rate a phase locked loop that corrects changes in phase due to frequency offsets, in the above-mentioned estimation system.

The objective of the present invention is achieved by a signal estimator comprising phase rotation means for rotating the phase of a received signal; estimation means for estimating the received signal with an output signal of the phase rotation means, based on a Viterbi algorithm, to obtain an estimation result, and then outputting the estimation result and a minimum error signal used to create a minimum path metric value in an estimation operation; delay means for delaying the output signal of the phase rotation means according to a period during which the estimation means outputs the minimum error signal; phase detection means for detecting a phase shift of the received signal based on the minimum error signal and the delay means; and filter means for limiting the frequency band of an output signal from the phase detection means; and signal generation means for generating a signal of a frequency proportional to the output of the filter means and then controlling the phase rotation means to rotate the phase of the received signal.

Moreover according to the present invention, the signal estimator comprises phase rotation means for rotating the phase of a received signal based on a control signal; a plurality of subtraction means each for obtaining as an error signal a difference between the received signal and plural sample signals; estimation means having means for outputting as a minimum error signal the error signal corresponding to a minimum path, and means for estimating the received signal with an output signal from the phase rotation means, based on a Viterbi algorithm, to obtain an estimation result, and then outputting the estimation result and the minimum error signal; delay means for delaying the output signal from the phase rotation means according to a period during which the estimation means outputs the minimum error signal; phase detection means for detecting a phase shift of the received signal based on the minimum error signal and an output signal from the delay means; filter means for performing a filtering process to limit the frequency band of an output signal from the phase detection means; and signal generation means for generating a signal of a frequency proportional to an output signal from the filter means and then outputting the generated signal as the control signal.

Moreover according to the present invention,

A method for correcting a phase shift of a received signal, comprises the steps of rotating the phase of a received signal based on a control signal; estimating the received signal with the phase-rotated signal, based on a Viterbi algorithm, to obtain an estimation result, and then outputting the estimation result and a minimum error signal used to create a minimum path metric value in an estimation operation; delaying the phase-rotated signal according to a period during which the minimum error signal is output; detecting a phase shift of the received signal based on the minimum error signal and the delayed output signal; limiting the frequency band of the detected signal of which the phase is shifted; and generating a signal of a frequency proportional to a detected signal of which the frequency band is limited, and then outputting the generated signal as the control signal.

Moreover, according to the present invention, in a memory medium wherein a program is stored, the program comprises the steps of rotating the phase of a received signal; estimating the received signal with the phase rotated signal, based on a Viterbi algorithm, to obtain an estimation result, and then outputting the estimation result and a minimum error signal used to create a minimum path metric value in the estimation operation; delaying the phase rotated signal according to a period during which the estimation means outputs the minimum error signal; detecting a phase shift of the received signal based on the minimum error signal and the delay signal; performing a filtering process to limit the frequency band of the phase detected signal; and generating a signal of a frequency proportional to the filtered signal, whereby the signal rotates the phase of the received signal in the phase rotation step, based on the generated signal.

In the signal estimator or the memory medium storing a program, the estimation means may be a maximum likelihood sequence estimator (MLSE) or a delayed decision feedback sequence estimator (DDFSE). Moreover, the estimation means may have a plurality of subtraction functions each for obtaining as an error signal a difference between the received signal and plural sampling signals; and a function for outputting as the error signal the error signal corresponding to a minimum path.

BRIEF DESCRIPTION OF THE INVENTION

These and other objects, features, and advantages of the present invention will become more apparent upon a reading of the following detailed description and drawings, in which.

DESCRIPTION OF THE EMBODIMENTS

The signal estimator according to embodiments of the present invention will be described below with reference to the attached drawings.

Figure 1:
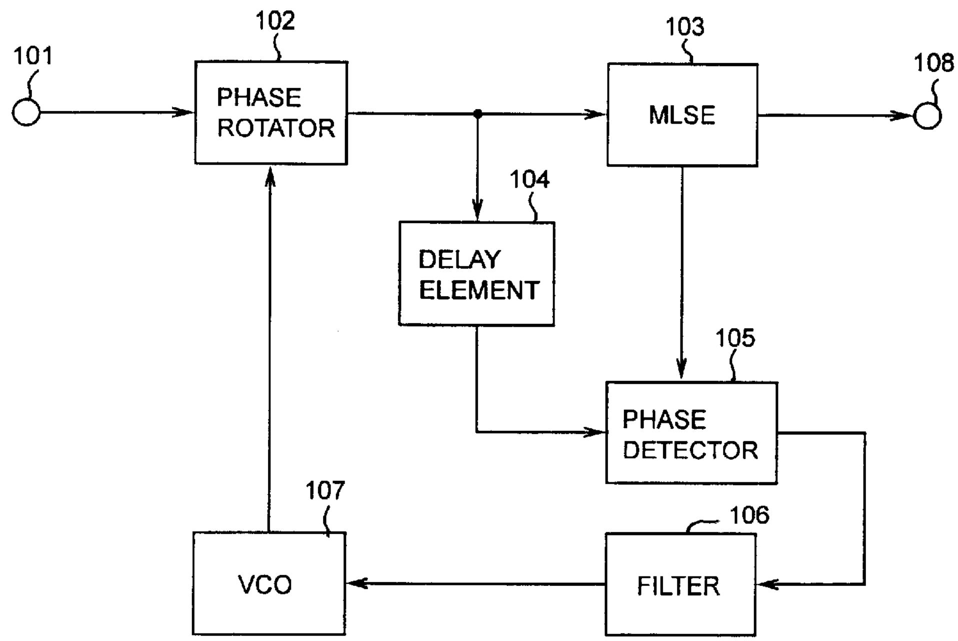
FIG. 1 is a block diagram illustrating a signal estimator according to the first embodiment of the present invention.

FIG. 1 a block diagram illustrating the configuration of a signal estimator according to a first embodiment of the present invention. Referring to FIG. 1, a phase rotator 102 rotates the phase of a received signal input through the input terminal 101 to compensate the phase shift. The maximum likelihood sequence estimator (MLSE) 103 receives the output of the phase rotator 102. Thus, the maximum likelihood sequence estimator (MLSE) 103 estimates the received signal based on the Viterbi algorithm and then outputs the estimation result to the output terminal 108.

The MLSE 103 outputs to the phase detector 105 an error signal as a minimum error signal used to create a minimum path metric signal in the Viterbi algorithm. Generally, the square value of the magnitude of an error signal is used as a branch metric in the Viterbi algorithm. The delay element 104 delays the output of the phase rotator 102 by the time corresponding to the delay produced by the MLSE 103. The timing of the output signal from the delay element 104 can be coincided with the timing of the minimum error signal from the MLSE 103.

The phase detector 105 detects a phase shift contained in the received signal based on the signal output from the delay element 104 and the minimum error signal output from the MLSE 103. The filter 106 filters the phase difference signal from the phase detector 105 and then outputs the filtered signal to the VCO 107. The VCO 107 outputs the phase amount to be corrected, to the phase rotator 102. The phase rotator 102 outputs the received signal phase-corrected with the output signal of the VCO 107. This loop calculation allows the phase variation, e.g. a frequency offset, contained in a received signal to be absorbed.

Next, the operation of the signal estimator according to the present embodiment will be described below.

Figure 2:
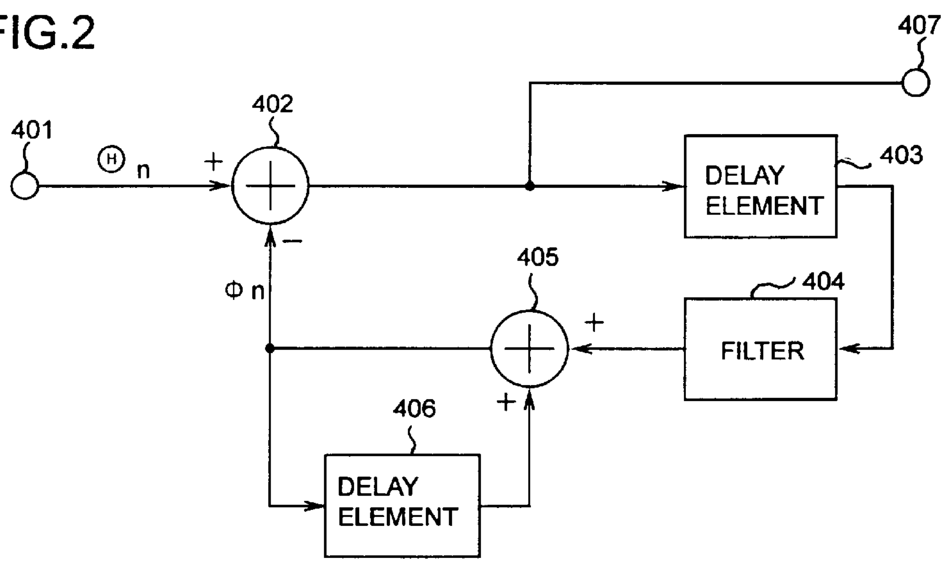
FIG. 2 is a block diagram illustrating the configuration of a phase locked loop.

FIG. 2 is a block diagram illustrating the circuit configured by considering only the phase shift component of a received signal in the configuration of FIG. 1. Referring to FIG. 2, an adder 402 corresponds to the phase rotator of FIG. 1. A delay element 403 corresponds to the combination of the MLSE 103, the delay element 104, and the phase detector 105, shown in FIG. 1. An integrator configured of a delay element 406 and an adder 405 corresponds to the VCO 107 of FIG. 1.

When attention is paid on the phase shift component only, it can be interpreted that the configuration of FIG. 2 corresponds to the configuration where the delay element 403 is added in the conventional PLL (phase locked loop). The configuration of the present invention differs from the conventional one in the delay of the delay element in FIG. 2. The configuration of the present invention can shorten the delay, compared with the prior-art configuration.

In the present embodiment, information on a maximum path metric is used to detect the phase shift contained in a received signal. This operation will be explained using the trellis transition diagram having four statuses and eight branches, shown in FIG. 3.

Figure 3:
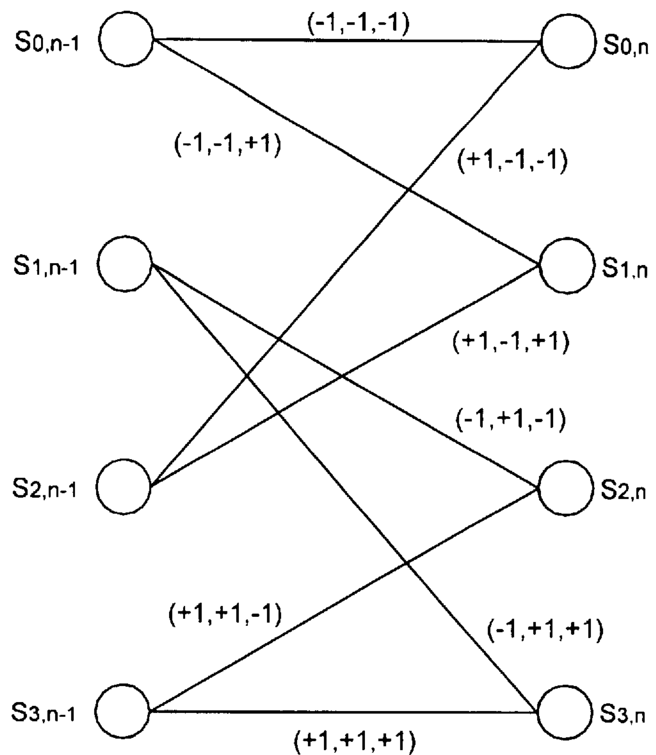
FIG. 3 is a diagram illustrating the four-status trellis transition explaining the operation of a maximum likelihood sequence estimator (MLSE)

In order to estimate an estimation signal in a conventional Viterbi algorithm, the smallest path is selected among path metric values $S_{0,n}$ to $S_{3,n}$ in FIG. 3. The so-called trace back procedure is carried out where the estimation signal is determined by judging how the past path counted back from the smallest path by a value (e.g. 10 symbols) is.

In the embodiment, the phase shift contained in a received signal is detected by performing arithmetic based on the state of the current path. That is, the smallest path metric value is first found among path metric values $S_{0,n}$ to $S_{3,n}$. Next, a branch metric used for the path metric operation is found. The error signal used for the branch metric operation is extracted as a minimum error signal. In the operation based on the conventional Viterbi algorithm, a square value of the magnitude of an error signal becomes a branch metric.

Compared with the conventional phase shift detecting method using estimation results obtained by the trace back, the above-mentioned operation has a phase shift detection capability slightly degraded. However, this operation can largely reduce the delay in the loop because the minimum error signal can be reflected to the phase locked loop without any delay. Hence, the delay in the loop is largely reduced, so that the phase tracking response of the phase locked loop can be improved.

The phase comparator 105 can detect a phase shift contained in a received signal based on the minimum error signal and the received signal. If the phase rotation amount of the phase rotator 102 is set to a fixed value and the phase of the received signal is varying, the phase detector 105 outputs only the phase variation component of the received signal. When the phase locked loop is operated, the phase rotator 102 phase-corrects the received signal according to the phase variation component.

In other words, the filter 106 (FIG. 1) limits the frequency band of the phase shift component and then inputs the resultant output to the VCO 107, so that the phase shift is corrected. The response characteristic of the phase locked loop (FIG. 2) is determined by the delay of the delay element 403 and by the frequency characteristic of the filter 404. The response characteristic of the phase locked loop can be improved by widening the frequency band of the filter 106. However, since the phase locked loop becomes susceptible to external disturbances such as noises, the response accuracy thereof is deteriorated. Moreover, the response rate of the phase locked loop can be improved by reducing the delay of the delay element 403. In this case, since a shortened delay does not lead to poor response accuracy, the phase locked loop can control the phase correction even in large variations in phase of the received signal.

Next, the configuration of the present embodiment will be described in more detail. Let us now assume that an impulse response to a transmission path distortion is spread to three symbols ($h_0$, $h_1$, $h_2$) and that binary phase shift keying (BPSK) is used as the modulation system.

In order to estimate the BPSK signal subjected to the transmission path distortion, the MLSE 103 uses the four-state Viterbi algorithm shown in FIG. 3. That is, the number of paths is four and the number of branches is eight.

Figure 4:
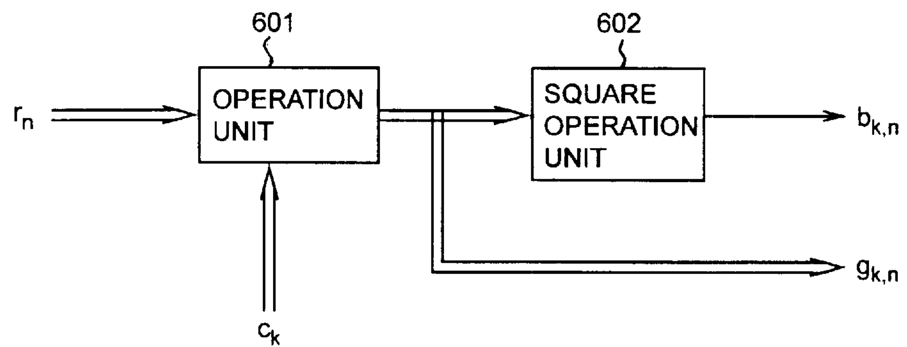
FIG. 4 is a block diagram illustrating the configuration for obtaining an error signal and a branch metric.

The configuration for obtaining error signals is shown in FIG. 4. The subtractor 601 calculates the difference between a received signal $r_n$ and a sample signal $c_k$ and then outputs an error signal $g_{k,n}$ to the square operation unit 602. The square operation unit 602 outputs as a branch metric $b_{k,n}$ the square of the magnitude of the error signal. Eight blocks shown in FIG. 4 are needed to obtain 8 types of branch metrics ($b_{0,n}$ to $b_{7,n}$).

Figure 5:
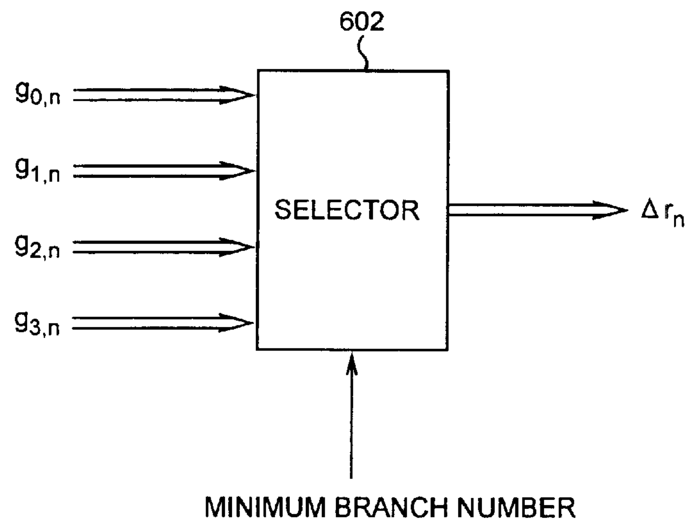
FIG. 5 is a block diagram illustrating the configuration for obtaining a minimum error signal.

FIG. 5 shows the configuration for obtaining minimum error signals. A path with the smallest path metric value is selected among four paths shown in FIG. 3. The branch number connected to the selected path is input as a minimum branch number to the selector 603 shown in FIG. 5. The selector 603 selects the minimum error signal $\Delta r_n$ of the eight error signals ($g_{0,n}$ to $g_{7,n}$).

Figure 6:
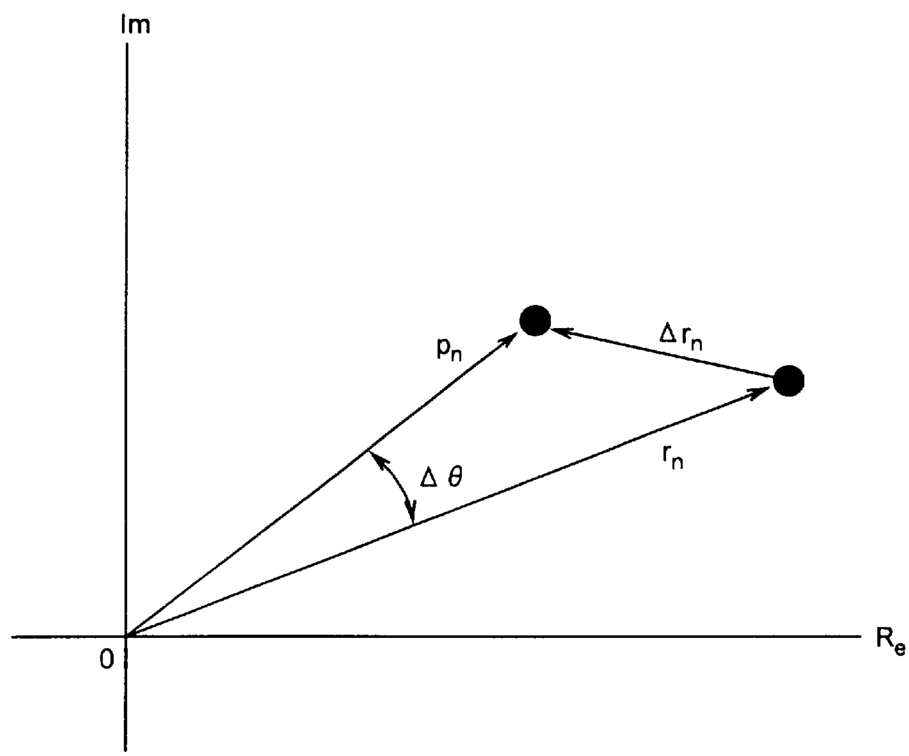
FIG. 6 is a vector diagram illustrating the characteristic relationship between a received signal and a minimum error signal.

The delay element 104 delays the received signal to compensate the time shift between a tentative decision value and the received signal. The delay element 104 is configured of registers serially connected. The phase detector 105 obtains a phase shift of the received signal based on the received signal $r_n$ and the minimum error signal $\Delta r_n$. FIG. 6 shows the phase difference $\Delta\theta$ of each signal on a complex plane expressed by complex numbers. Referring to FIG. 6, $p_n$ is a received signal expected by the MLSE 103.

Figure 7:
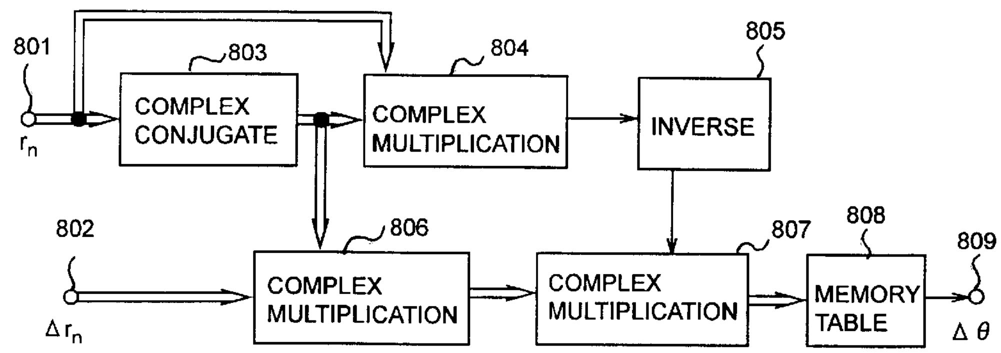
FIG. 7 is a block diagram illustrating the configuration of a phase detector.

FIG. 7 shows an arithmetic block for obtaining a phase difference $\Delta\theta$. An accurate phase difference can be calculated with the circuit block shown in FIG. 7. However, because the circuit block requires the multiplier, the inverse operation unit, and the memory table, the circuit scale becomes large. In order to avoid such a drawback, the approximate expression of the formula (26) (to be described later) for obtaining $\Delta\theta$ is used if $\Delta\theta$ is sufficiently small. Since a received signal with a small magnitude tends to be susceptible to noises, errors may be easily added to the phase difference signal.

Figure 8:
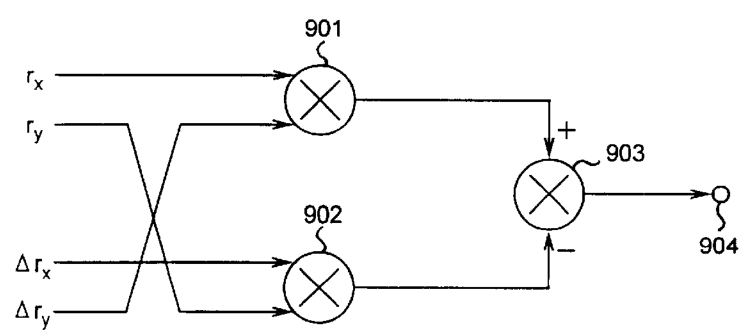
FIG. 8 is a block diagram illustrating another configuration of a phase detector.

In order to deal with such a problem, when the amplitude of the received signal is small, the phase difference signal is multiplied by the power value of the received signal. When the magnitude of the received signal is large, the response of the phase locked loop is slowed. The block circuit that deals with the above-mentioned operation is shown in FIG. 8. This circuit is formed of two multipliers 901 and 902 and an adder 903.

Referring again to FIG. 1, the phase detector 105 outputs its output signal to the filter 106. The filter characteristics determine the response of the phase locked loop. The loop characteristic suitable to the tracking of phase variations can be obtained by selecting coefficients $\alpha$ and $\beta$.

Figure 9:
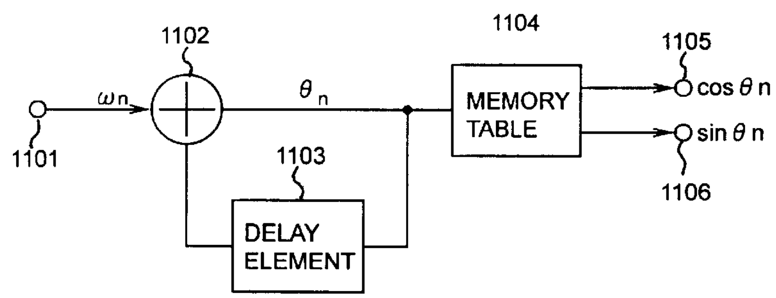
FIG. 9 is a block diagram illustrating a digital VCO that creates sine wave signals from angular frequency signals.

FIG. 9 is a block diagram illustrating the VCO 107 converted into digitized form. A combination of the adder 1102 and the delay element 1103 performs an integral operation to convert the input frequency component into a phase component. Moreover, in order to obtain the complex signal, the sine wave component and the cosine wave component are obtained by referring to the memory table 1104.

The VCO 107 inputs its output signal as a signal for rotating the phase of a received signal, to the phase comparator 102. When a complex signal is input as an input signal, the phase rotator 102 is equivalent to a complex multiplier.

Next, the operation of the digital VCO 107 according to the present embodiment will be described in more detail below.

The MLSE 103 estimates the BPSK signal subjected to a distortion due to the transmission path. In the Viterbi algorithm shown in FIG. 3, eight error signals are obtained by the following formulas (1) to (8).

$$g_{0,n}=r_n-(-h_0-h_1-h_2) \quad (1)$$

$$g_{1,n}=r_n-(+h_0-h_1-h_2) \quad (2)$$

$$g_{2,n}=r_n-(-h_0-h_1-h_2) \quad (3)$$

$$g_{3,n}=r_n-(+h_0+h_1-h_2) \quad (4)$$

$$g_{4,n}=r_n-(-h_0-h_1+h_2) \quad (5)$$

$$g_{5,n}=r_n-(+h_0-h_1+h_2) \quad (6)$$

$$g_{6,n}=r_n-(-h_0+h_1+h_2) \quad (7)$$

$$g_{7,n}=r_n-(+h_0+h_1+h_2) \quad (8)$$

where $r_n$ is a received signal on the n-th symbol.

Eight branch metrics are obtained by the following formulas (9) to (16).

$$b_{0,n}=|g_{0,n}|^2 \quad (9)$$

$$b_{1,n}=|g_{1,n}|^2 \quad (10)$$

$$b_{2,n}=|g_{2,n}|^2 \quad (11)$$

$$b_{3,n}=|g_{3,n}|^2 \quad (12)$$

$$b_{4,n}=|g_{4,n}|^2 \quad (13)$$

$$b_{5,n}=|g_{5,n}|^2 \quad (14)$$

$$b_{6,n}=|g_{6,n}|^2 \quad (15)$$

$$b_{7,n}=|g_{7,n}|^2 \quad (16)$$

The path metric is obtained by the following formulas (17) to (20). Min[A,B] represents an operation of extracting a smaller one of A and B.

$$S_{0,n}=\min[(S_{0,n-1}+b_{0,n}),(S_{2,n-1}+b_{4,n})] \quad (17)$$

$$S_{1,n}=\min[(S_{0,n-1}+b_{1,n}),(S_{2,n-1}+b_{5,n})] \quad (18)$$

$$S_{2,n}=\min[(S_{1,n-1}+b_{2,n}),(S_{3,n-1}+b_{6,n})] \quad (19)$$

$$S_{3,n}=\min[(S_{1,n-1}+b_{3,n}),(S_{3,n-1}+b_{7,n})] \quad (20)$$

Moreover, the minimum path metric is obtained among four path metrics based on the following formula (21). The minimum error signal is obtained from the branch connecting to the path with the above-obtained number.

$$S_{min,n}=\min[S_{0,n},S_{1,n},S_{2,n},S_{3,n}] \quad (21)$$

The MLSE 103 outputs its estimation result to the output terminal 108 by carrying out a trace back from the path with the minimum path metric value.

FIG. 4 shows the configuration for obtaining the error signals and the branch metrics. FIG. 5 shows the configuration for obtaining the minimum error signal. Eight types of sample signals $c_k$, that is, ($c_0$ to $c_7$) are created based on impulse responses ($h_0$, $h_1$, $h_2$) subjected to transmission path distortion. Differences between received signals and sample signals become error signals ($g_{0,n}$ to $g_{7,n}$) expressed by the formulas (1) to (8). Squares of the magnitudes of the error signals become the branch metrics ($b_{0,n}$ to $b_{7,n}$) expressed by the formulas (9) to (16). The error signal corresponding to the number of the branch connected to the path in which the path metric value is minimum becomes the minimum error signal $\Delta r_n$.

The phase detector 105, shown in FIG. 7, obtains the phase difference $\Delta\theta$ based on the received signal $r_n$ and the minimum error signal $\Delta r_n$. The received signal and the received signal expected by the MLSE 103 are expressed in complex numbers by the following formulas (22) and (23). The phase difference is expressed by calculating the following formulas (24) and (25). The complex conjugator 803 converts the received signal $r_n$ into a complex conjugate signal.

$$r=|r|e^{j\theta} \quad (22)$$

$$p=|p|e^{j\phi} \quad (23)$$

$$e^{j\Delta\theta}=e^{j(\phi-\theta)}=\frac{r}{|r|}\times\frac{p}{|p|}\approx\frac{r^*(r+\Delta r)}{|r|^2}=1+\frac{r^*\Delta r}{|r|^2} \quad (24)$$

$$e^{j\Delta\theta}\approx 1+j\Delta\theta \quad (25)$$

The complex conjugator 804 multiplies a received signal by the complex conjugate of the received signal to obtain the power value of the received signal. The inverse number unit 805 obtains the inverse of the power value of a received signal. The complex conjugator 806 performs a complex multiplication of the complex conjugate of a received signal and the minimum error signal. The complex multiplier 807 multiplies the resultant signal by the inverse of the power value of the received signal. The multiplication result is expressed as the right side of the above formula (24).

The phase difference $\Delta\theta$ can be obtained by referring to the memory table 808. That is, the addresses on the memory table represent the right side of the formula (24). The output data corresponding to each address corresponds to $\Delta\theta$.

FIG. 8 is shows the phase detector 105 that can approximately detect the phase shift to the formula (26) by merely calculating the formula (27). This can be realized by means of the multipliers 901 and 902 and the adder 903.

$$\Delta\theta\approx Im[r^*\Delta r/|r|^2] \quad (26)$$

$$|r|^2\Delta\theta\approx Im[r^*\Delta r] \quad (27)$$

Figure 10:
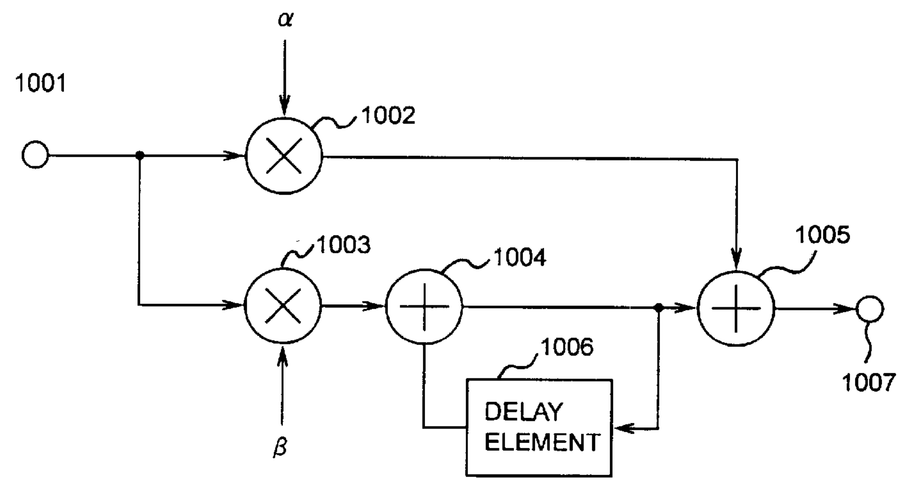
FIG. 10 is a block diagram illustrating the configuration of a filter.

The phase detector 105 sends its output to the filter 106. The filter characteristic determines the response of the phase locked loop. As shown in FIG. 10, the filter configuration with the transfer characteristic expressed by the formula (28) is used as a typical primary filter. Referring to FIG. 10, the filter consists of an input terminal 1001, multipliers 1002 and 1003, an adders 1004 and 1005, a delay element 1006, and an output terminal 1007. The attenuation coefficient or proper frequency of the loop characteristic can be selected by changing the coefficient $\alpha$ of the multiplier and the coefficient $\beta$ of the multiplier 1003.

$$F(z)=\alpha+\frac{\beta}{1-z^{-1}} \quad (28)$$

FIG. 9 shows the VCO 207 configured in digitized form. This digital circuit operates as a VCO by referring to the memory table 1104 to obtain sine waves based on the integration operation and the phase. In other words, If the input signal of the input terminal 1101 is 0, a constant value is continuously output from the output terminals 1105 and 1106 of the memory table 1104. On the other hand, when an input signal with a positive or negative value is continuously input from the output terminal 1101, the output terminals 1105 and 1106 output a sine wave signal of which the phase rotates at a constant angular velocity in the positive or negative direction.

The VCO 107 outputs its output signal to the phase rotator 102 to rotate the phase of the received signal. By calculating the formula (29), the received signal input to the input terminal 101 is phase-rotated by the phase angle of s sine wave signal output from the VCO 107. This principle corresponds to the rotation of the coordinate.

$$\begin{aligned}(I+jQ') &= (I+jQ)e^{j\theta} \\ &= (I\cos\theta - Q\sin\theta) + j(I\sin\theta + Q\cos\theta)\end{aligned} \quad (29)$$

In the above calculation, even when the received signal contains phase variation components, the phase detector 105 detects the phase variation components. The phase rotator 102 can correct the phase components according to the phase variation amount. Hence, since the phase variation component of the signal received by the MLSE 103 is reduced, the signal estimator can perform signal estimation substantially equivalent to that in the case of no phase variation components.

Next, the second embodiment of the present invention will be described below.

Figure 11:
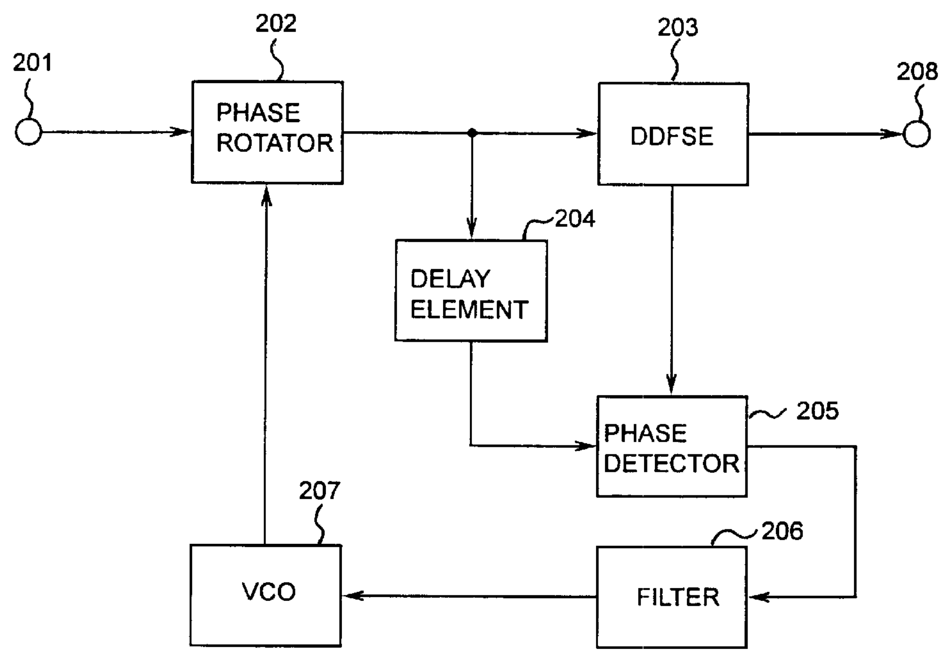
FIG. 11 is a block diagram illustrating a signal estimator according to the second embodiment of the present invention.

The signal estimation can be realized using the DDFSE, instead of the MLSE. FIG. 11 is a block diagram illustrating a signal estimator using DDFSE, according to the second embodiment of the present invention. In this configuration, the DDFSE 203 of FIG. 2 is used instead of the MLSE 103 of FIG. 1. Other constituent elements are not changed. The input terminal 201 corresponds to the input terminal 101 of FIG. 1. The phase rotator 202 corresponds to the phase rotator 102 of FIG. 1. The constituent elements 204 to 207 correspond to the constituent elements 104 to 107 of FIG. 1, respectively.

Figure 12:
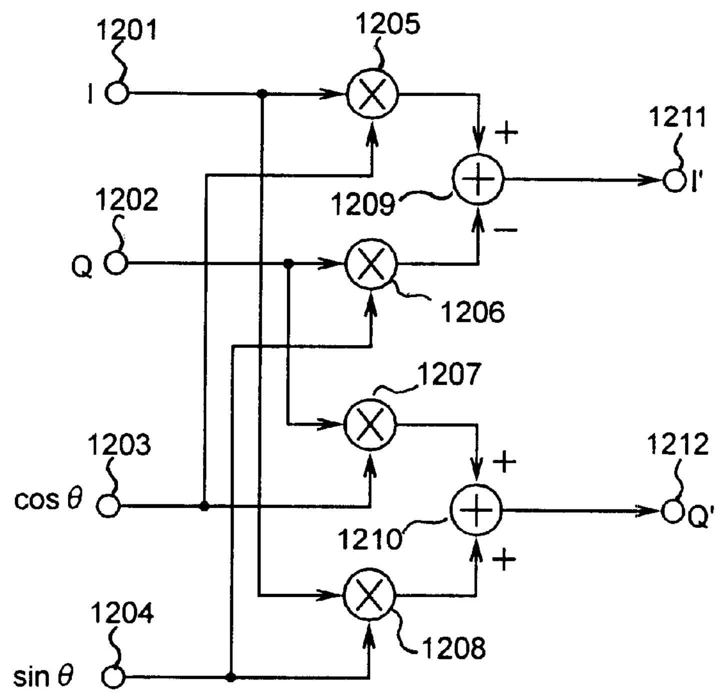
FIG. 12 is a block diagram illustrating the configuration of a phase rotator.

FIG. 12 shows the configuration of the phase rotator 202. The phase rotator 202 consists of an in-phase component input terminal 1201, a quadrature component input terminal 1202, a cosine wave input terminal 1203, a sine wave input terminal 1204, multipliers 1205 to 1208, adders 1209 and 1210, an in-phase component output terminal 1211, and a quadrature component output terminal 1212.

Figure 13:
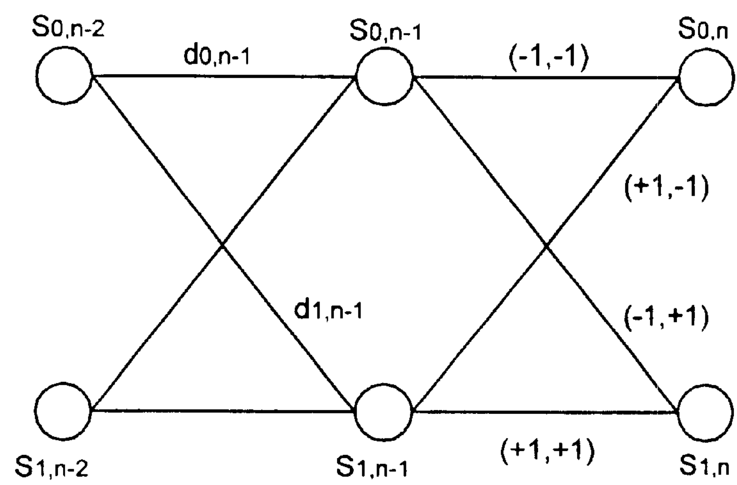
FIG. 13 is a diagram illustrating a two-status trellis transition explaining the operation of a delayed decision feedback sequence estimator (DDFSE)
Figure 14:
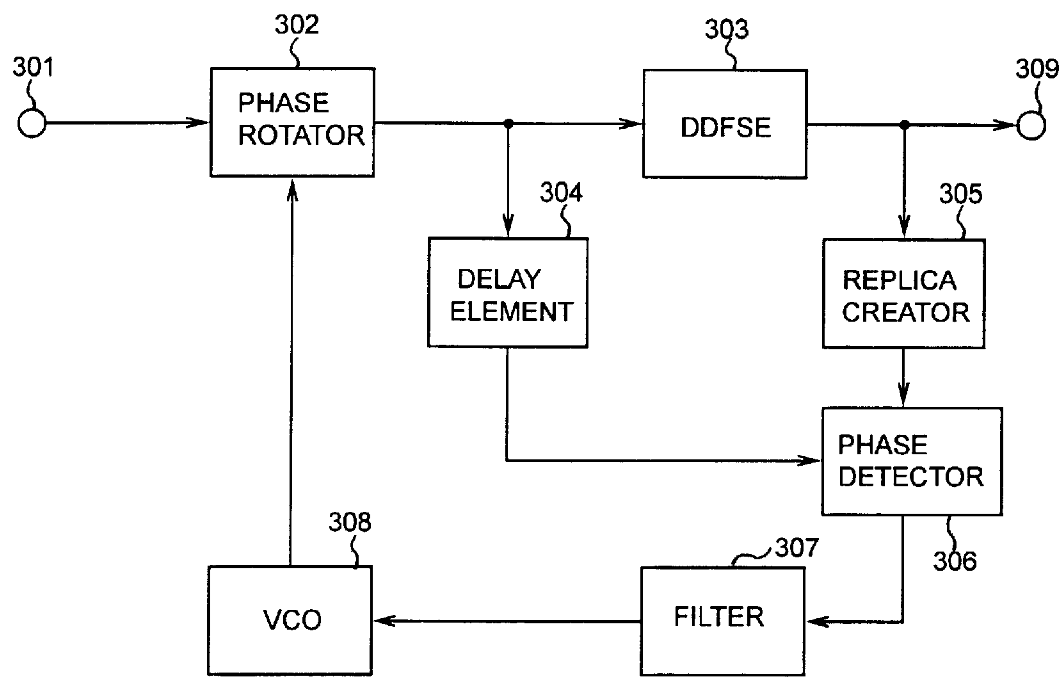
FIG. 14 is a block diagram illustrating a conventional signal estimator with a phase locked loop.

It can be regarded that the DDFSE 203 is equivalent to the configuration where the Viterbi algorithm in FIG. 3 is degenerated as shown in FIG. 13. FIG. 3 shows a four-state Viterbi algorithm. However, the DDFSE 203 can be realized with the two-state Viterbi algorithm shown in FIG. 13. The Viterbi algorithm shown in FIG. 13 has four branches only. Hence, for the signal estimation, error signals and branch metrics are created using tentative decision values $d_{0,n-1}$ and $d_{1,n-1}$ in each status behind by one symbol.

The arithmetic expression for error signals and branch metrics is shown as the following formulas (30), (33), (34) and (37).

$$g_{0,n}=r_n-(-h_0-h_1+d_{0,n-1}h_2) \quad (30)$$

$$g_{1,n}=r_n-(+h_0-h_1+d_{0,n-1}h_2) \quad (31)$$

$$g_{2,n}=r_n-(-h_0+h_1+d_{1,n-1}h_2) \quad (32)$$

$$g_{3,n}=r_n-(+h_0+h_1+d_{1,n-1}h_2) \quad (33)$$

$$b_{0,n}=|g_{0,n}|^2 \quad (34)$$

$$b_{1,n}=|g_{1,n}|^2 \quad (35)$$

$$b_{2,n}=|g_{2,n}|^2 \quad (36)$$

$$b_{3,n}=|g_{3,n}|^2 \quad (37)$$

The path metric can be obtained by the following formulas (38) and (39).

$$S_{0,n}=\min[(S_{0,n-1}+b_{0,n}),(S_{1,n-1}+b_{2,n})] \quad (38)$$

$$S_{1,n}=\min[(S_{0,n-1}+b_{1,n}),(S_{1,n-1}+b_{3,n})] \quad (39)$$

In a similar manner to that of the MLSE, the minimum error signal can be obtained by comparing the path metrics $s_{0,n}$ and $S_{1,n}$ and then finding a branch connected to a small path.

As described above, according to the present invention, the signal estimator with a phase locked loop, comprises a phase rotator for rotating the phase of a received signal according to the phase of an output signal from a voltage-controlled oscillator (VCO); a maximum likelihood sequence estimator (MLSE) or delayed decision feedback sequence estimator (DDFSE) for estimating the received signal in response to the output signal from the phase rotator, based on a Viterbi algorithm, and then outputting as a minimum error signal the estimation result and an error signal used to create a minimum path metric in an estimation operation; a delay element for delaying the output signal of the phase rotator by a delay after which the MLSE or DDFSE outputs a minimum error signal; a phase detector for detecting a phase shift of the received signal based on the minimum error signal and the output signal of the delay element; and a filter for limiting the frequency band of an output signal from the phase detector; and a voltage-controlled oscillator for generating a sine wave signal of a frequency proportional to the output of the filter and then outputting it to the phase rotator.

In order to detect the phase shift of a received signal, each of the above embodiments uses information about minimum path metrics in a Viterbi algorithm used in the MLSE or DDFSE, instead of the decision signals of the MLSE or DDFSE. The phase shift of a received signal is first detected based on the error signal and the received signal used to obtain the minimum path metric. Then, the feedback loop corrects the phase shift, e.g. a frequency offset, of the received signal.

Until the MLSE or DDFSE receives a received signal and then outputs an estimation result, a certain delay occurs. However, since information about the minimum path metric can be output nearly without any delay, the delay of the delay element can be shortened. The small delay of the delay element improves the delay in the phase locked loop. As a result, the high-rate response of the phase locked loop can be realized.

The configuration shown in FIGS. 1 and 11 can be realized in hardware or in a computer system including a CPU and a memory. In the computer configuration, the memory forms a memory medium of the present invention. The memory medium stores a program for executing the above operation. Semiconductor memories, optical disks, magneto-optic disks, magnetic recording media may be used as the memory medium.

According to the present invention, the receiver in the digital communication system, which includes the MLSE or DDFSE that corrects the transmission distortion of a received signal, can compensate phase variations such as frequency offsets at high-rate response.

In the conventional receiver adopting the MLSE or DDFSE, the phase variations are corrected according to the decision results of the MLSE or DDFSE. However, according to the present invention, the phase variations are corrected with the information on the minimum path metrics within the MLSE or DDFSE, thus decreasing the delay of the phase correction loop. Even when a frequency offset caused by large transmission distortion is added to the phase of a received signal, the response to phase variations can be improved.

Particularly, in the conventional method where decision results of the MLSE or DDFSE are used, large transmission distortion increases the delay for which a decision result is obtained. Hence, according to the present invention, the response time is effectively sped up, comparison with the conventional art.

The entire disclosure of Japanese Application No. 10-359847 filed Dec. 17, 1998 including specification, claims, drawing and summary are incorporated herein by reference in its entirely.

What is claimed is:

1. A signal estimator, comprising:

phase rotation means for rotating the phase of a received signal;

estimation means for estimating said received signal with an output signal of said phase rotation means, based on a Viterbi algorithm, to obtain an estimation result, and then outputting said estimation result and a minimum error signal used to create a minimum path metric value in an estimation operation;

delay means for delaying the output signal of said phase rotation means according to a period during which said estimation means outputs said minimum error signal;

phase detection means for detecting a phase shift of said received signal based on said minimum error signal and said delay means;

filter means for limiting the frequency band of an output signal from said phase detection means; and signal generation means for generating a signal of a frequency proportional to the output of said filter means and then controlling said phase rotation means to rotate the phase of said received signal.

2. The signal estimator defined in claim 1, wherein said estimation means comprises a maximum likelihood sequence estimator (MLSE).

3. The signal estimator defined in claim 1, wherein said estimation means comprises a delayed decision feedback sequence estimator (DDFSE).

4. The signal estimator defined in claim 1, wherein said estimation means comprises:

a plurality of subtraction means each for obtaining as an error signal a difference between said received signal and plural sampling signals; and output means for outputting as said error signal said error signal corresponding to a minimum path.

5. A signal estimator comprising:

phase rotation means for rotating the phase of a received signal based on a control signal;

a plurality of subtraction means each for obtaining as an error signal a difference between said received signal and plural sample signals;

estimation means having means for outputting as a minimum error signal said error signal corresponding to a minimum path, and means for estimating said received signal with an output signal from said phase rotation means, based on a Viterbi algorithm, to obtain an estimation result, and then outputting said estimation result and said minimum error signal;

delay means for delaying said output signal from said phase rotation means according to a period during which said estimation means outputs said minimum error signal;

phase detection means for detecting a phase shift of said received signal based on said minimum error signal and an output signal from said delay means;

filter means for performing a filtering process to limit the frequency band of an output signal from said phase detection means; and signal generation means for generating a signal of a frequency proportional to an output signal from said filter means and then outputting the generated signal as said control signal.

6. The signal estimator defined in claim 5, wherein said estimation means comprises a maximum likelihood sequence estimator (MLSE).

7. The signal estimator defined in claim 5, wherein said estimation means comprises a delayed decision feedback sequence estimator (DDFSE).

8. A method for correcting a phase shift of a received signal, comprising the steps of:

rotating the phase of a received signal based on a control signal;

estimating said received signal with said phase-rotated signal, based on a Viterbi algorithm, to obtain an estimation result, and then outputting said estimation result and a minimum error signal used to create a minimum path metric value in an estimation operation;

delaying said phase-rotated signal according to a period during which said minimum error signal is output;

detecting a phase shift of said received signal based on said minimum error signal and said delayed output signal;

limiting the frequency band of said detected signal of which the phase is shifted; and generating a signal of a frequency proportional to a detected signal of which the frequency band is limited, and then outputting the generated signal as said control signal.

9. The method defined in claim 8, wherein said estimating step comprises the step of estimating said received signal by means of a maximum likelihood sequence estimator (MLSE).

10. The method defined in claim 8, wherein said estimating step comprises the step of estimating said received signal by means of a delay decision feedback sequence estimator (DDFSE).

11. The method defined in claim 8, wherein said estimating step comprises the sub-steps of:

performing plural subtraction processes to obtain as an error signal a difference between said received signal and plural sample signals; and outputting as said minimum error signal said error signal corresponding to a minimum path.

12. A memory medium wherein a program is stored, said program comprising the steps of:

rotating the phase of a received signal;

estimating said received signal with said phase rotated signal, based on a Viterbi algorithm, to obtain an estimation result, and then outputting said estimation result and a minimum error signal used to create a minimum path metric value in said estimation operation;

delaying said phase rotated signal according to a period during which said estimation means outputs said minimum error signal;

detecting a phase shift of said received signal based on said minimum error signal and said delay signal;

performing a filtering process to limit the frequency band of said phase detected signal; and generating a signal of a frequency proportional to said filtered signal, whereby said signal rotates the phase of said received signal in said phase rotation step, based on said generated signal.

13. The memory medium defined in claim 12, wherein said estimation step comprises the step of performing a maximum likelihood sequence estimation operation process.

14. The memory medium defined in claim 12, wherein said estimation step comprises the step of performing a delayed decision feedback sequence estimation operation process.

15. The memory medium defined in claim 12, wherein said estimation step comprises the steps of:

performing a plurality of subtraction steps to obtain as an error signal a difference between said received signal and plural sampling signals; and outputting as said minimum error signal said error signal corresponding to a minimum path.

* * * * *